(12) United States Patent
Shimizu et al.

(10) Patent No.: US 7,914,953 B2
(45) Date of Patent: Mar. 29, 2011

(54) PHOTOMASK AND PATTERN FORMATION METHOD USING THE SAME

(75) Inventors: Tadami Shimizu, Kyoto (JP); Akio Misaka, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 222 days.

(21) Appl. No.: 12/204,252

(22) Filed: Sep. 4, 2008

(65) Prior Publication Data
US 2009/0075182 A1 Mar. 19, 2009

(30) Foreign Application Priority Data

Sep. 19, 2007 (JP) ................................. 2007-242195

(51) Int. Cl.
G03F 1/00 (2006.01)
H01L 21/00 (2006.01)
(52) U.S. Cl. ........................................... 430/5; 430/311
(58) Field of Classification Search ................ 430/5, 311
See application file for complete search history.

(56) References Cited

U.S. PATENT DOCUMENTS

| | | | |
|---|---|---|---|
| 5,723,236 A | 3/1998 | Inoue et al. | |
| 5,725,969 A | 3/1998 | Lee | |
| 5,888,674 A | 3/1999 | Yang et al. | |
| 6,207,333 B1 | 3/2001 | Adair et al. | |
| 6,255,023 B1 * | 7/2001 | Huang et al. | 430/5 |
| 6,413,684 B1 * | 7/2002 | Stanton | 430/5 |
| 6,703,168 B1 * | 3/2004 | Misaka | 430/5 |
| 7,060,395 B2 | 6/2006 | Misaka | |
| 7,147,975 B2 | 12/2006 | Misaka | |
| 2002/0197544 A1 | 12/2002 | Iwasaki | |
| 2005/0069788 A1 | 3/2005 | Tanaka et al. | |
| 2005/0277034 A1 | 12/2005 | Mitsui | |
| 2006/0093963 A1 | 5/2006 | Terahara | |

(Continued)

FOREIGN PATENT DOCUMENTS

JP 09-281690 10/1997

(Continued)

OTHER PUBLICATIONS

United States Office Action, issued in U.S. Appl. No. 12/181,650, mailed Jun. 9, 2010.

(Continued)

*Primary Examiner* — Stephen Rosasco
*Assistant Examiner* — Jonathan Jelsma
(74) *Attorney, Agent, or Firm* — McDermott Will & Emery LLP

(57) ABSTRACT

A photomask includes: a transparent substrate having a transparent property against exposing light; a first light-shielding pattern formed on the transparent substrate and having a first dimension; a second light-shielding pattern formed on the transparent substrate and having a second dimension larger than the first dimension; and an opening provided in part of the transparent substrate where the first light-shielding pattern and the second light-shielding pattern are not formed. The first light-shielding pattern includes a first semi-light-shielding portion and an auxiliary pattern which is arranged within the first semi-light-shielding portion and allows the exposing light to pass through in an opposite phase with respect to the first semi-light-shielding portion. The second light-shielding pattern includes a second semi-light-shielding portion and a light-shielding portion which does not substantially allow the exposing light to pass through.

19 Claims, 11 Drawing Sheets

U.S. PATENT DOCUMENTS

| | | |
|---|---|---|
| 2006/0121384 A1 | 6/2006 | Patel et al. |
| 2007/0003879 A1* | 1/2007 | Chang et al. ............... 430/311 |
| 2009/0061328 A1* | 3/2009 | Nonami et al. .................. 430/5 |
| 2009/0061330 A1* | 3/2009 | Irie et al. ........................ 430/5 |

FOREIGN PATENT DOCUMENTS

| | | |
|---|---|---|
| JP | 2001-296647 | 10/2001 |
| JP | 2003-322949 | 11/2003 |

OTHER PUBLICATIONS

United States Office Action, issued in U.S. Appl. No. 12/200,478, mailed Jun. 15, 2010.

United States Office Action, issued in U.S. Appl. No. 12/181,650, mailed Nov. 3, 2010.

United States Office Action, issued in U.S. Appl. No. 12/200,478, mailed Nov. 15, 2010.

* cited by examiner

PHASE DIFFERENCE OF 180°

LIGHT INTENSITY

EXPOSURE THRESHOLD VALUE

PHASE DIFFERENCE OF 180°

PHOTOMASK AND PATTERN FORMATION METHOD USING THE SAME

BACKGROUND OF THE INVENTION

1. Field of the Invention

The present invention relates to a photomask used for forming a fine pattern in fabrication of a semiconductor integrated circuit device and a pattern formation method using the photomask.

2. Description of Related Art

Recently, there are increasing demands for refinement of a circuit pattern due to a high degree of integration of a large scale integrated circuit device (hereinafter referred to as an LSI) realized by using a semiconductor. As a result, great importance is placed on refinement of a line pattern forming the circuit or a contact hole pattern for connecting multiple wiring layers through insulating layers. For the formation of the line pattern, a technique of simultaneously forming isolated patterns and densely arranged patterns has been required. For achieving large depth of focus in the formation of the densely arranged line patterns, it is essential to perform oblique-incidence exposure (off-axis exposure). However, the oblique-incidence exposure considerably deteriorates contrast and the depth of focus of the isolated line patterns. The contrast and the depth of focus are deteriorated more significantly when a half-tone phase-shifting mask, which is widely used for improvement in resolution, is used. On the other hand, when a light source of low coherence suitable for the formation of isolated fine line patterns is used, the formation of the dense patterns becomes difficult.

As described above, the optimum lighting condition for the isolated fine line patterns is contradictory to the optimum lighting condition for the densely arranged line patterns. Therefore, in order to form the densely arranged fine patterns and the isolated patterns at the same time, tradeoff is made on the effect of a vertical incident light component and the effect of an oblique incident light component emitted from a light source. As a result, a light source having a medium degree of coherence (about 0.5 to 0.6) is used. In this case, however, the effects of the vertical incident light component and the oblique incident light components cancel each other. This makes it difficult to achieve the simultaneous refinement of the dense patterns and the isolated patterns to enhance the degree of integration of the semiconductor device. One of the most effective solutions to this problem is use of an enhancer mask (see Patent Document 1).

Hereinafter, the principle of pattern formation using the enhancer mask according to Patent Document 1 is explained with reference to FIGS. 12A to 12D. FIGS. 12A and 12B show an exemplified plane structure and an exemplified cross-sectional structure of the enhancer mask. As shown in FIGS. 12A and 12B, the enhancer mask includes a transparent substrate 11 having a transparent property against exposing light, on which provided are a semi-light-shielding portion 12 having a predetermined transmittance to the exposing light, an auxiliary pattern 13 surrounded by the semi-light-shielding portion 12 and an opening 14 in which the semi-light-shielding portion 12 and the auxiliary pattern 13 are not formed. The semi-light-shielding portion 12 and the opening 14 allow the exposing light to pass through in an identical phase. The auxiliary pattern 13 allows the exposing light to pass through in an opposite phase with respect to the semi-light-shielding portion 12 and the opening 14, but is not transferred on a wafer by exposure.

FIG. 12C is a diagram for showing a light intensity profile obtained by using the enhancer mask of FIGS. 12A and 12B, and FIG. 12D is a schematic diagram for showing the plane structure of a pattern to be transferred onto a wafer by the enhancer mask of FIGS. 12A and 12B. As shown in FIG. 12C, in the photomask shown in FIGS. 12A and 12B, light passing through the auxiliary pattern 13 surrounded by the semi-light-shielding portion 12 cancels a portion of light passing through the opening 14 and coming around the back of the semi-light-shielding portion 12. Therefore, if the intensity of light passing through the auxiliary pattern 13 is adjusted so that the light coming around the back of the semi-light-shielding portion 12 is canceled, a dark portion in which the light intensity is reduced to approximately 0 is formed in the light intensity distribution.

The light passing through the auxiliary pattern 13 pronouncedly cancels the light coming around the back of the semi-light-shielding portion 12, while it slightly cancels the light passing near the edge of the semi-light-shielding portion 12. As a result, the light intensity profile of the light passing through the photomask of FIGS. 12A and 12B becomes steep in part thereof from the vicinity of the semi-light-shielding portion 12 to the center of the auxiliary pattern 13. Thus, the light passing through the photomask of FIGS. 12A and 12B, i.e., the enhancer mask, shows a sharp light intensity profile. Therefore, as shown in FIG. 12D, a high contrast image is formed.

As described above, with the provision of the auxiliary pattern 13 in the semi-light-shielding portion 12 having a light-shielding property, a considerably dark portion corresponding to a region (auxiliary pattern 13) surrounded by the outline of the semi-light-shielding portion 12 is formed in a light intensity image formed by using the photomask of FIGS. 12A and 12B. This makes it possible to provide light intensity distribution with enhanced contrast between the light intensity of the center of the auxiliary pattern 13 and the light intensity around the semi-light-shielding portion 12. Thus, the enhancer mask is highly effective for the simultaneous formation of the fine isolated line pattern (e.g., a pattern having a width smaller than $(0.5 \times \lambda/NA)$ ($\lambda$: a wavelength of the exposing light, NA: numerical aperture)) and the densely arranged line patterns.

[Patent Document 1] Publication of Japanese Patent Application No. 2003-322949

SUMMARY OF THE INVENTION

The enhancer mask is actually effective for the above-described fine pattern formation. However, use of the enhancer mask brings about the following problem for the formation of relatively large line patterns, e.g., those having a width larger than $(0.5 \times \lambda/NA)$.

FIGS. 13A and 13B show an exemplified plane structure and an exemplified cross-sectional structure of the enhancer mask. In FIGS. 13A and 13B, like reference numerals are used to refer to like elements of the mask of FIGS. 12A and 12B so as to avoid repetition of the description. In the enhancer mask shown in FIGS. 13A and 13B, the width of a light-shielding pattern including a semi-light-shielding portion 12 and an auxiliary pattern 13 is larger than $(0.5 \times \lambda/NA)$.

FIG. 13C is a diagram of a light intensity profile obtained in using the enhancer mask of FIGS. 13A and 13B. FIG. 13D is a schematic plan view of a pattern transferred onto a wafer by the enhancer mask of FIGS. 13A and 13B. As shown in FIG. 13C, when the enhancer mask of FIGS. 13A and 13B whose light-shielding pattern has a large width is used, a side lobe occurs in the light intensity profile corresponding to the light-shielding pattern. Therefore, when the local maximum value of the light intensity of the side lobe exceeds an exposure threshold value for sensitizing a resist, a side lobe pattern is disadvantageously transferred as part of the transferred pattern on the wafer as shown in FIG. 13D.

With the foregoing in mind, an object of the invention is to simultaneously form a fine isolated line pattern and a large line pattern by using an enhancer mask capable of simultaneously forming a fine line pattern and densely arranged patterns.

In order to achieve the object, the present inventors have studied as described below.

As described above, the enhancer mask is highly effective for simultaneously forming a fine isolated line pattern having a width smaller than $(0.5 \times \lambda/NA)$ and densely arranged line patterns. However, in the formation of a line pattern having a width larger than $(0.5 \times \lambda/NA)$ or a rectangular pattern, an unwanted side lobe pattern is formed within the resulting pattern.

As a solution to this problem, the present inventors have used a photomask having a pattern (hereinafter referred to as a light-shielding pattern) for forming a line pattern of a width larger than $(0.5 \times \lambda/NA)$ not including an auxiliary pattern. That is, the inventors have examined whether or not the occurrence of a side lobe pattern is restrained by using a photomask having a light-shielding pattern including only a semi-light-shielding portion. However, without the auxiliary pattern, the light-shielding pattern is formed only of the semi-light-shielding portion which allows the exposing light to pass through in an identical phase with respect to the opening. As a result, the slope of the light intensity profile formed by the light-shielding pattern becomes gentle, thereby reducing the resolution.

Further, the present inventors have examined the light-shielding pattern for forming a line pattern provided with a light-shielding portion (having substantially zero transmittance to the exposing light) for the purpose of making the slope of the light intensity profile formed by the light-shielding pattern steeper by blocking the exposing light to a further degree, i.e., for the purpose of restraining the reduction of resolution.

FIGS. 14A and 14B show an exemplified plane structure and an exemplified cross-sectional structure of a photomask including a light-shielding pattern formed of a light-shielding portion. As shown in FIGS. 14A and 14D, on the transparent substrate 11 having a transparent property against exposing light, provided are a light-shielding portion 15 which does not substantially allow the exposing light to pass through and an opening 14 in which the light-shielding portion 15 is not formed. Although the cross-sectional structure of the photomask may vary depending on the structure of other light-shielding patterns which are not shown, the light-shielding portion 15 may be formed on the transparent substrate 11 with a semi-light-shielding portion 12 interposed therebetween as shown in FIG. 14B. Alternatively, the light-shielding portion 15 may be formed directly on the transparent substrate 11 without the semi-light-shielding portion 12 interposed therebetween. Use of the photomask of FIGS. 14A and 14B makes it possible to restrain the formation of a side lobe pattern in a transferred pattern.

However, when the photomask of FIGS. 14A and 14B is used in combination with a chemically amplified resist and a top coat, there arises another problem in that a considerable resist defect is caused around the transferred pattern as described later. The reason is as follows.

In accordance with recent refinement, use of a chemically amplified resist is essential. In pattern formation using a chemically amplified resist, an acid having a catalytic function is produced through a photochemical reaction caused in exposure, and the acid is used as a catalyst in a reaction of functional groups included in a resist polymer in annealing process performed after the exposure, so as to form a pattern by utilizing property change caused in the reaction. In this case, in positive resist process, a pattern is formed by dissolving, in a developer, merely a portion irradiated with exposing light for reacting the functional groups.

A chemically amplified resist is known to have a characteristic of very high reactivity. Particularly, an ArF resist used in the ArF exposure process has high reactivity, and since a surface portion of the resist is easily reacted with any ambient substance, an insoluble layer insoluble in the developer is frequently formed in the vicinity of the surface of the resist.

Furthermore, in pattern formation of an LSI of a 45 nm or finer rule, immersion exposure has been employed for improving resolution capability and preventing degradation of a DOF (depth of focus) derived from increase of the NA. In the immersion exposure, the exposure is performed with a liquid having a higher refractive index than the air (hereinafter referred to as the immersion liquid) present between a wafer and a projector lens of an aligner. In the immersion exposure, in order to prevent resist characteristic degradation derived from direct contact between a resist and the immersion liquid, the direct contact between the resist and the immersion liquid is avoided by coating the resist surface with a resist protection film designated as a top coat. Although the direct contact between the resist and the immersion liquid can be avoided by using the top coat, since the resist is in direct contact with the top coat, a chemical reaction is caused on the contact face therebetween, so that an insoluble layer insoluble in the developer can be more easily formed.

When a region of the resist where the insoluble layer is formed is irradiated with light, the resist surface is dissolved during development and adhesion between the insoluble layer and the resist is lowered, and hence, the insoluble layer can be easily removed out of the wafer through rinsing process performed after the development.

On the other hand, in a completely unexposed region not irradiated with the light at all (namely, a region with light intensity of zero), the adhesion between the insoluble layer and the resist is not lowered, and hence, the insoluble layer cannot be removed out of the wafer through the rinsing process. Therefore, the insoluble layer scatters around the completely unexposed region, resulting in causing a resist defect on the wafer.

Therefore, in order to restrain the reduction of resolution, when the light-shielding pattern for forming a pattern having a width larger than $(0.5 \times \lambda/NA)$ includes a light-shielding portion (having substantially zero transmittance to the exposing light) as described above, most of a region on the wafer corresponding to the light-shielding pattern is occupied by a completely unexposed region. As a result, a considerable resist defect occurs.

As described above, for the formation of a pattern having a width larger than $(0.5 \times \lambda/NA)$, use of the light-shielding pattern formed of the semi-light-shielding portion leads to the reduction of the resolution, while use of the light-shielding pattern formed of the light-shielding portion leads to the occurrence of the resist defect.

On the basis of the aforementioned finding, the present inventors have devised the following invention so that, in the case where a fine line pattern and a pattern larger than the fine line pattern are formed simultaneously by using an enhancer mask capable of simultaneously forming a fine isolated line pattern and densely arranged patterns in the exposure process (including the immersion exposure process) using a chemically amplified resist and a top coat in combination, the reduction of resolution and the occurrence of the resist defect are simultaneously restrained in the formation of the larger pattern.

The photomask of the present invention includes: a transparent substrate having a transparent property against exposing light; a first light-shielding pattern formed on the transparent substrate and having a first dimension; a second light-shielding pattern formed on the transparent substrate and having a second dimension larger than the first dimension; and an opening provided in part of the transparent substrate where the first light-shielding pattern and the second light-shielding pattern are not formed, wherein the first light-shielding pattern includes a first semi-light-shielding portion which allows the exposing light to partially pass through and an auxiliary pattern which is arranged within the first semi-light-shielding portion and allows the exposing light to pass through in an opposite phase with respect to the first semi-light-shielding portion and the second light-shielding pattern includes a second semi-light-shielding portion which allows the exposing light to partially pass through and a light-shielding portion which does not substantially allow the exposing light to pass through.

In the present application, the dimension of the first light-shielding pattern refers to a width of the first light-shielding pattern (a width in the direction perpendicular to the extending direction of the line pattern: this is applied throughout the following description) corresponding to a line pattern (an isolated line pattern or part of densely arranged line patterns). The dimension of the second light-shielding pattern refers to a width of the pattern when the second light-shielding pattern is used for line pattern formation, while it refers to a length of a short side when the second light-shielding pattern is used for rectangular pattern formation (a length of each side when a square-shaped pattern is formed). However, the shape of the second light-shielding pattern is not particularly limited.

Furthermore, to have a transparent property against exposing light herein means to have transmittance sufficiently high for sensitizing a resist, and to have a light-shielding property against exposing light herein means to have transmittance sufficiently low for not sensitizing a resist (including zero). Also, an identical phase means that there is a phase difference not less than $(-30+360 \times n)$ degrees and not more than $(30+360 \times n)$ degrees (wherein n is an integer), and an opposite phase means that there is a phase difference not less than $(150+360 \times n)$ degrees and not more than $(210+360 \times n)$ degrees.

FIG. 1A is a plan view of a specific example of a photomask (an enhancer mask) according to the present invention, FIG. 1B is a cross-sectional view taken on line A-A' of FIG. 1A (showing a first light-shielding pattern formation region) and FIG. 1C is a cross-sectional view taken on line B-B' of FIG. 1A (showing a second light-shielding pattern formation region). As shown in FIGS. 1A through 1C, a first light-shielding pattern 6 having a first dimension not more than $(0.5 \times \lambda/NA) \times M$ (wherein $\lambda$ is a wavelength of the exposing light, NA is numerical aperture of a reduction projection optical system of an aligner and M is a reduction ratio of the reduction projection optical system) and a second light-shielding pattern 7 having a second dimension larger than $(0.5 \times \lambda/NA) \times M$ are formed on a transparent substrate 1 having a transparent property against exposing light. A portion of the transparent substrate 1 other than the first and second light-shielding patterns 6 and 7 is an opening 4.

As a characteristic of the photomask of this invention shown in FIGS. 1A through 1C, the first light-shielding pattern 6 includes a first semi-light-shielding portion 2A having a light-shielding property against the exposing light but allowing exposing light to partially pass through and an auxiliary pattern 3 surrounded by the first semi-light-shielding portion 2A and transmitting the exposing light in an opposite phase with respect to the first semi-light-shielding portion 2A. Further, the second light-shielding pattern 7 includes a second semi-light-shielding portion 2B having a light-shielding property against the exposing light but allowing exposing light to partially pass through and a light-shielding portion 5 surrounding the second semi-light-shielding portion 2B and substantially not allowing the exposing light to pass through. The light-shielding portion 5 provided as part of the second light-shielding pattern 7 has a predetermined dimension (hereinafter referred to as a Cr width $W_{Cr}$). For prevention of the occurrence of a side lobe, the second light-shielding pattern 7 is not provided with the auxiliary pattern.

According to the photomask of the present invention, the second light-shielding pattern 7 for forming a relatively large pattern is provided with not only the second semi-light-shielding portion 2B but also the light-shielding portion 5. Further, the Cr width $W_{Cr}$ of the light-shielding portion 5 is adjusted to be not more than a dimension with which a completely unexposed region which will be a cause of a resist defect is not formed. Thus, the reduction of resolution and the occurrence of the resist defect are simultaneously restrained.

According to the photomask of the present invention, the Cr width $W_{Cr}$ is preferably not less than $(0.17 \times \lambda/NA) \times M$ and not more than $(1.72 \times \lambda/NA) \times M$. Within this range, the reduction of resolution and the occurrence of the resist defect are surely restrained.

A pattern formation method of this invention is directed to a pattern formation method in which the photomask of this invention is used. The pattern formation method of this invention includes the steps of: (a) forming a resist film on a substrate; (b) irradiating the resist film with the exposing light through the photomask; and (c) patterning the resist film by developing the resist film having been irradiated with the exposing light.

In the pattern formation method of this invention, a pattern can be formed while simultaneously suppressing the reduction of resolution and the occurrence of a resist defect derived from an unexposed region.

As described so far, according to the present invention, even when an enhancer mask which capable of simultaneously forming a fine isolated line pattern and densely arranged line patterns is used in an exposure process or an immersion exposure process using ArF excimer laser or the like as a light source so as to simultaneously form the fine isolated line pattern and a line pattern larger than it, the reduction of resolution and the occurrence of a resist defect can be simultaneously prevented in the formation of the larger pattern, so that a fine LSI can be fabricated.

Specifically, the present invention relates to a photomask used in forming a fine pattern in fabrication of a semiconductor integrated circuit device and a pattern formation method using the photomask, and is very useful for pattern formation or the like employing the ArF exposure process or the ArF immersion exposure process.

DETAILED DESCRIPTION OF THE INVENTION

Prerequisites

Prerequisites for describing a preferred embodiment of the invention will be first described.

Since a photomask is generally used in a reduction projection type aligner, it is necessary to consider a reduction ratio in arguing a pattern dimension on the mask. However, in order to avoid confusion, in the description of the embodiment below, when a pattern dimension on a mask is mentioned in correspondence to a desired pattern to be formed (such as a resist pattern), a value obtained by converting the pattern dimension by using a reduction ratio is used unless otherwise mentioned. Specifically, in the case where a resist pattern with a width of 70 nm is formed by using a mask pattern with a width of M×70 nm in a 1/M reduction projection system, the width of the mask pattern and the width of the resist pattern are both described as 70 nm.

Also, in the embodiment of the invention, M and NA respectively indicate a reduction ratio and numerical aperture of a reduction projection optical system of an aligner and $\lambda$ indicates the wavelength of exposing light unless otherwise mentioned.

Moreover, pattern formation is described on the assumption that positive resist process for forming a resist pattern correspondingly to an unexposed region of a resist is employed. In the case where negative resist process is employed instead of the positive resist process, since an unexposed region of a resist is removed in the negative resist process, a resist pattern of the positive resist process is replaced with a space pattern.

Moreover, it is assumed that a photomask described in the embodiment of the invention is a transmission mask. In the case where the present photomask is applied to a reflection mask instead of a transmission mask, since a transparent region and a light-shielding region of a transmission mask respectively correspond to a reflection region and a non-reflection region, the transmission phenomenon of a transmission mask is replaced with the reflection phenomenon. Specifically, an opening or a transparent region of a transmission mask is replaced with a reflection portion or a reflection region, and a light-shielding portion is replaced with a non-reflection portion. Furthermore, a region partially transmitting light in a transmission mask is replaced with a region partially reflecting light in a reflection mask, and transmittance is replaced with reflectance.

EMBODIMENT

A photomask according to an embodiment of the invention will now be described with reference to the accompanying drawings.

Figure 1A:
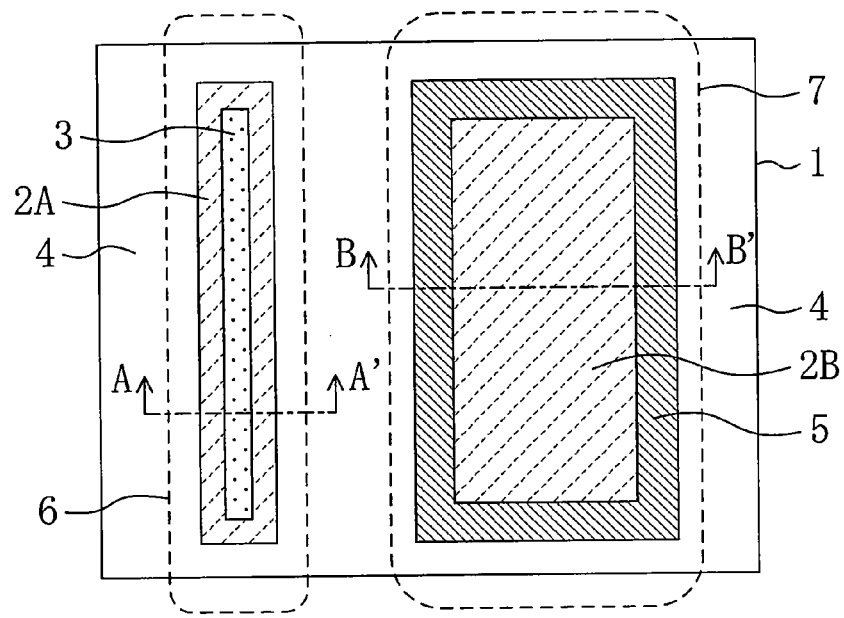
FIG. 1A is a plan view of an exemplified photomask according to the embodiment of the invention.
Figure 1B:
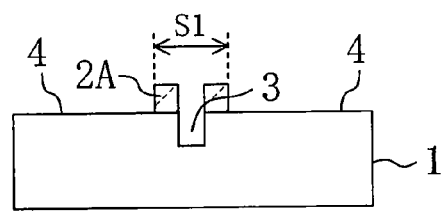
FIG. 1B is a cross-sectional view taken on line A-A' of FIG. 1A
Figure 1C:
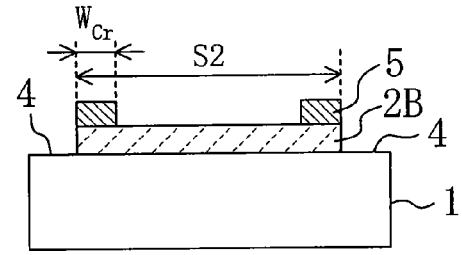
FIG. 1C is a cross-sectional view taken on line B-B' of FIG. 1A.
Figure 1D:
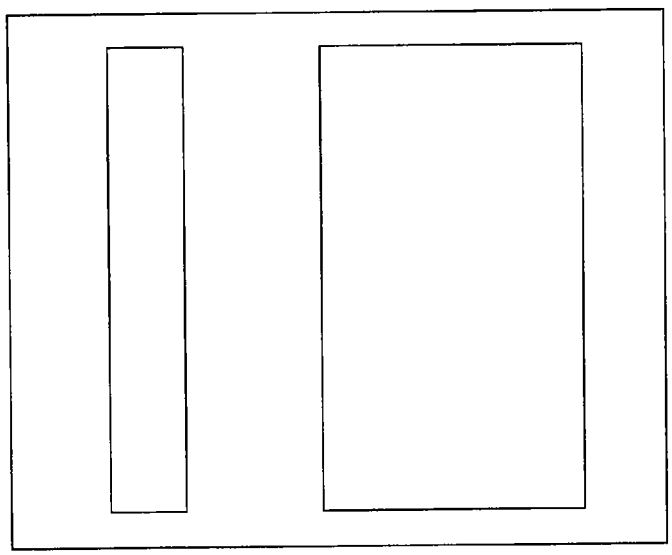
FIG. 1D is a diagram of an exemplified pattern to be formed by using the photomask according to an embodiment of the invention shown in FIGS. 1A to 1C.

FIG. 1A is a plan view of an example of the photomask of this embodiment, FIG. 1B is a cross-sectional view taken on line A-A' of FIG. 1A (showing a first light-shielding pattern formation region) and FIG. 1C is a cross-sectional view taken on line B-B' of FIG. 1B (showing a second light-shielding pattern formation region). FIG. 1D shows an example of a pattern to be formed by using the photomask according to the embodiment of the invention shown in FIGS. 1A to 1C.

As shown in FIGS. 1A to 1C, a first light-shielding pattern 6 having a first dimension S1, for example, not more than $(0.5×\lambda/NA)×M$ (wherein $\lambda$ is a wavelength of the exposing light, NA is numerical aperture of a reduction projection optical system of an aligner and M is a reduction ratio of the reduction projection optical system) and a second light-shielding pattern 7 having a second dimension S2, for example, larger than $(0.5×\lambda/NA)×M$, are formed on a transparent substrate 1 having a transparent property against exposing light. Part of the transparent substrate 1 where the first light-shielding pattern 6 and the second light-shielding pattern 7 are not formed is an opening 4.

As a characteristic of the photomask of the present embodiment shown in FIGS. 1A to 1C, the first light-shielding pattern 6 includes a first semi-light-shielding portion 2A having a light-shielding property against the exposing light and allowing the exposing light to partially pass through and an auxiliary pattern 3 surrounded by the first semi-light-shielding portion 2A and allowing the exposing light to pass through in an opposite phase with respect to the first semilight-shielding portion 2A. The second light-shielding pattern 7 includes a second semi-light-shielding portion 2B having a light-shielding property against the exposing light and allowing the exposing light to partially pass through and a light-shielding portion 5 surrounding the second semi-light-shielding portion 2B and substantially not allowing the exposing light to pass through. The light-shielding portion 5 provided as part of the second light-shielding pattern 7 has a predetermined dimension (hereinafter referred to as a Cr width $W_{Cr}$). For the prevention of the occurrence of a side lobe, the second light-shielding pattern 7 is not provided with the auxiliary pattern.

In the present embodiment, the first semi-light-shielding portion 2A and the second semi-light-shielding portion 2B allow the exposing light to pass through in an identical phase with respect to the opening 4.

In the present embodiment, the first light-shielding pattern 6 is linear-shaped and the second light-shielding pattern 7 is rectangular-shaped (including a linear shape and a square shape).

According to the photomask of the present embodiment, the second light-shielding pattern 7 for forming a relatively large pattern is provided with not only the second semi-light-shielding portion 2B but also the light-shielding portion 5. Therefore, as compared with the case where the second light-shielding pattern 7 consists of only the second semi-light-shielding portion 2B, reduction of resolution is prevented. Further, when the Cr width $W_{Cr}$ of the light-shielding portion 5 formed as part of the second light-shielding pattern 7 is determined to be not more than a dimension with which a completely unexposed region which will be a cause of a resist defect is not formed, the occurrence of the resist defect is restrained. That is, the reduction of resolution and the occurrence of a resist defect are simultaneously restrained.

In the case where, for example, a line pattern having a width, for example, not more than (0.5×λ/NA), is formed by using the first light-shielding pattern 6, the Cr width $W_{Cr}$ for the second light-shielding pattern 7 which makes it possible to simultaneously suppress the reduction of resolution and the occurrence of a resist defect is obtained through simulation. The results are as follows. In the simulation, the semi-light-shielding portions 2A and 2B are set to have transmittance of, for example, about 5 to 10%, against the exposing light and the phase of light passed through the semi-light-shielding portions 2A and 2B is identical to the phase of light passed through the opening 4 (the phase in this case is 0 degree). Also, the light-shielding portion 5 is set to have transmittance of 0% against the exposing light, namely, the light-shielding portion 5 is set to completely shield the exposing light. Further, the phase of light passed through the auxiliary pattern 3 surrounded by the first semi-light-shielding portion 2A of the first light-shielding pattern 6 is opposite to the phase of light passed through the opening 4 and the semi-light-shielding portions 2A and 2B (the phase in this case is 180 degrees).

When the second light-shielding pattern 7 for forming a relatively large pattern is provided with an auxiliary pattern, a side lobe is caused in a light intensity profile corresponding the second light-shielding pattern 7 due to exposing light passing through the auxiliary pattern in an opposite phase (with respect to the opening 4). When the local maximum value of the light intensity of the side lobe exceeds an exposure threshold value, a portion of a resist on a wafer is sensitized and hence an unwanted pattern is disadvantageously transferred. Accordingly, in order to prevent the occurrence of the side lobe, the second light-shielding pattern 7 of the present embodiment is not provided with an auxiliary pattern as shown in FIGS. 1A and 1C. However, when the second light-shielding pattern 7 consists of only the semi-light-shielding portion which allows the exposing light to pass through in an identical phase with respect to the opening 4 without forming the auxiliary pattern, the slope of the light intensity profile formed by the second light-shielding pattern 7 becomes gentle, thereby reducing the resolution. Therefore, in order to make the slope of the light intensity profile steeper by blocking the light, a light-shielding portion having a Cr width $W_{Cr}$ not less than a predetermined dimension is required in the second light-shielding pattern 7 in addition to the semi-light-shielding portion.

Figure 2:
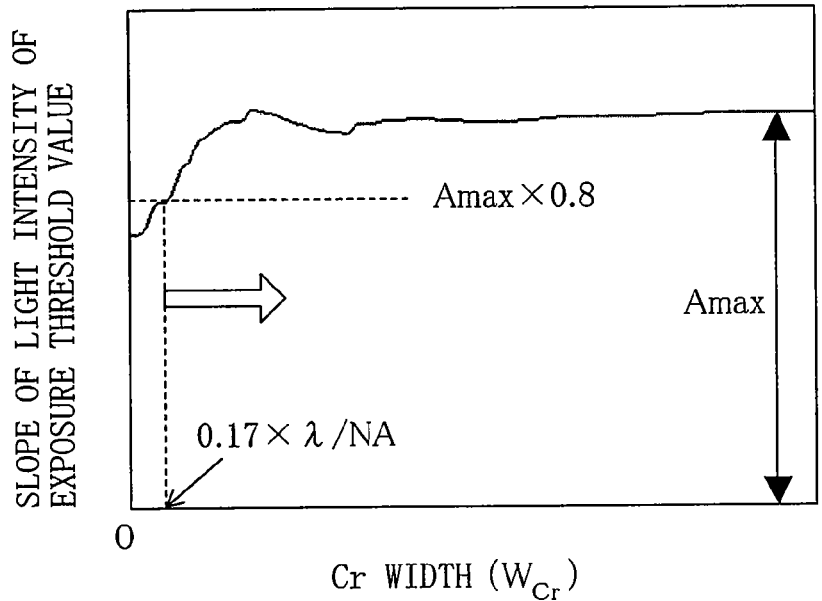
FIG. 2 is a diagram for showing the relationship, obtained by the present inventors through simulation, between the slope of light intensity profile of a light intensity value as an exposure threshold value and the Cr width $W_{Cr}$ of a light-shielding portion of a second light-shielding pattern.

FIG. 2 shows the relationship between the slope of light intensity profile of a light intensity value as an exposure threshold value and the Cr width $W_{Cr}$ obtained as a result of the simulation performed by the present inventors. In FIG. 2, the value of the slope of the light intensity profile is an absolute value. As the value increases, the slope of the light intensity profile becomes steeper. As shown in FIG. 2, when the Cr width $W_{Cr}$ is increased in the second light-shielding pattern 7, the amount of exposing light passing through the semi-light-shielding portion 2B is reduced, and hence, the slope of light intensity profile of a light intensity value as an exposure threshold value becomes steep. In order to obtain a resolution sufficiently high for transferring a pattern, the slope of light intensity profile of a light intensity value as an exposure threshold value is preferably not less than 80% of the slope of light intensity profile obtained when the Cr width $W_{Cr}$ is sufficiently large (Amax in FIG. 2). Specifically, when the Cr width $W_{Cr}$ is not less than (0.17×λ/NA), the light-shielding property of the second light-shielding pattern 7 is improved and hence, a resolution sufficient for transferring the pattern is obtained.

On the other hand, as described in "Summary of the Invention", when the Cr width $W_{Cr}$ is increased, namely, when a light-shielding region formed of a light-shielding portion is increased, a completely unexposed region is formed. As a result, a defect derived from an insoluble layer occurs in an exposure process. However, when the Cr width $W_{Cr}$ is small, light diffracted at the edge of the light-shielding portion comes around to the back of the light-shielding portion and hence the completely unexposed region is not formed.

Figure 3:
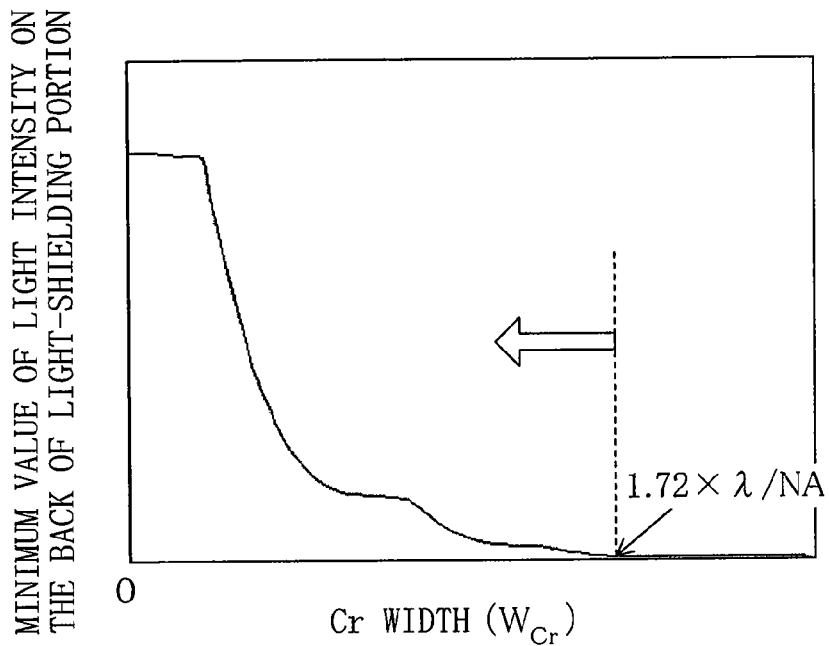
FIG. 3 is a diagram for showing the relationship, obtained by the present inventors through simulation, between the minimum value of light intensity on the back of the light-shielding portion of the second light-shielding pattern and the Cr width $W_{Cr}$ of the light-shielding portion.

FIG. 3 shows the relationship between the minimum value of the light intensity on the back of a light-shielding portion and the Cr width $W_{Cr}$ obtained as a result of simulation performed by the present inventors. As shown in FIG. 3, when the Cr width $W_{Cr}$ is increased, the minimum value of the light intensity on the back of a light-shielding portion is reduced, and when the Cr width $W_{Cr}$ is larger than 1.72×λ/NA, the minimum value of the light intensity on the back of a light-shielding portion is zero and a completely unexposed region is formed. Therefore, when the Cr width $W_{Cr}$ is smaller than 1.72×λ/NA, the formation of the completely unexposed region can be prevented, so as to prevent the occurrence of a defect derived from an insoluble layer.

As described so far, when the Cr width $W_{Cr}$ of the light-shielding portion 5 provided as part of the second light-shielding pattern 7 of the photomask of this embodiment is not less than 0.17×λ/NA and not more than 1.72×λ/NA, the reduction of resolution can be prevented as well as the occurrence of a defect derived from an insoluble layer resulting from a completely unexposed region can be prevented.

The aforementioned effect is obtained irrespective of the location of the light-shielding portion 5 in the second light-shielding pattern 7. However, when the light-shielding portion 5 is arranged to surround the second semi-light-shielding portion 2B in the second light-shielding pattern 7 as shown in FIGS. 1A and 1C, DOF which is a process margin for lithography is advantageously improved.

Although the structure as shown in FIGS. 1A through 1C is exemplified as the structure of the photomask of this embodiment, the photomask of the invention is not limited to this structure. Similar effects can be attained by employing any of structures shown in FIGS. 4A and 4B.

Figure 4A:
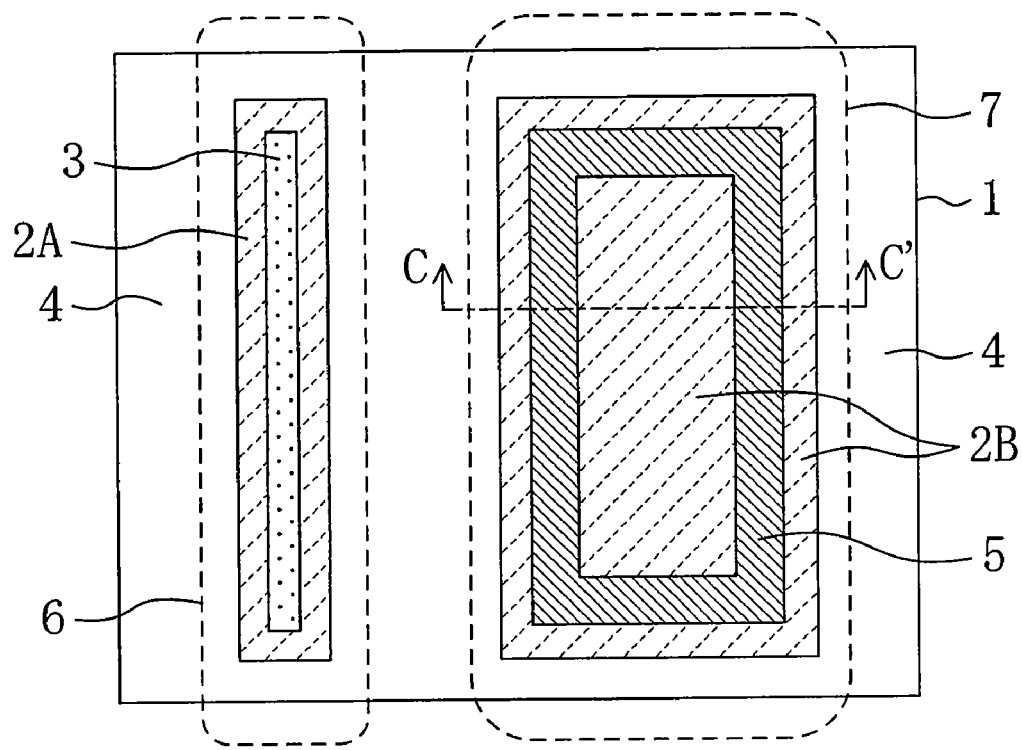
FIG. 4A is a plan view of another exemplified photomask according to the embodiment of the invention and FIG. 4B is a cross-sectional view taken on line C-C' of FIG. 4A (showing a second light-shielding pattern formation region).
Figure 4B:
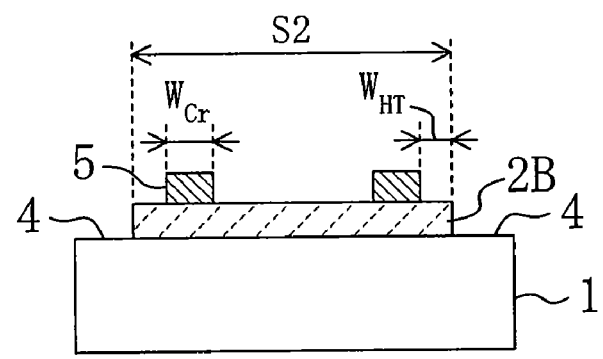

FIG. 4A is a plan view of another example of the photomask according to the embodiment of the invention, and specifically, another example of the photomask used for forming the desired pattern of FIG. 1D, and FIG. 4B is a cross-sectional view taken on line C-C' of FIG. 4A (showing a second light-shielding pattern formation region). In FIGS. 4A and 4B, like reference numerals are used to refer to like elements of the photomask of FIGS. 1A through 1C so as to avoid repetition of the description.

The photomask of FIGS. 4A and 4B is similar to the photomask shown in FIGS. 1A to 1C in that the second light-shielding pattern 7 mainly consists of the second light-shielding portion 2B and the light-shielding portion 5 is provided as part of the second light-shielding pattern 7. However, different from the photomask of FIGS. 1A to 1C, part of the second semi-light-shielding portion 2B (having a HT width $W_{HT}$) is present between the opening 4 and the light-shielding portion 5 in the photomask of FIGS. 4A and 4B.

Figure 5:
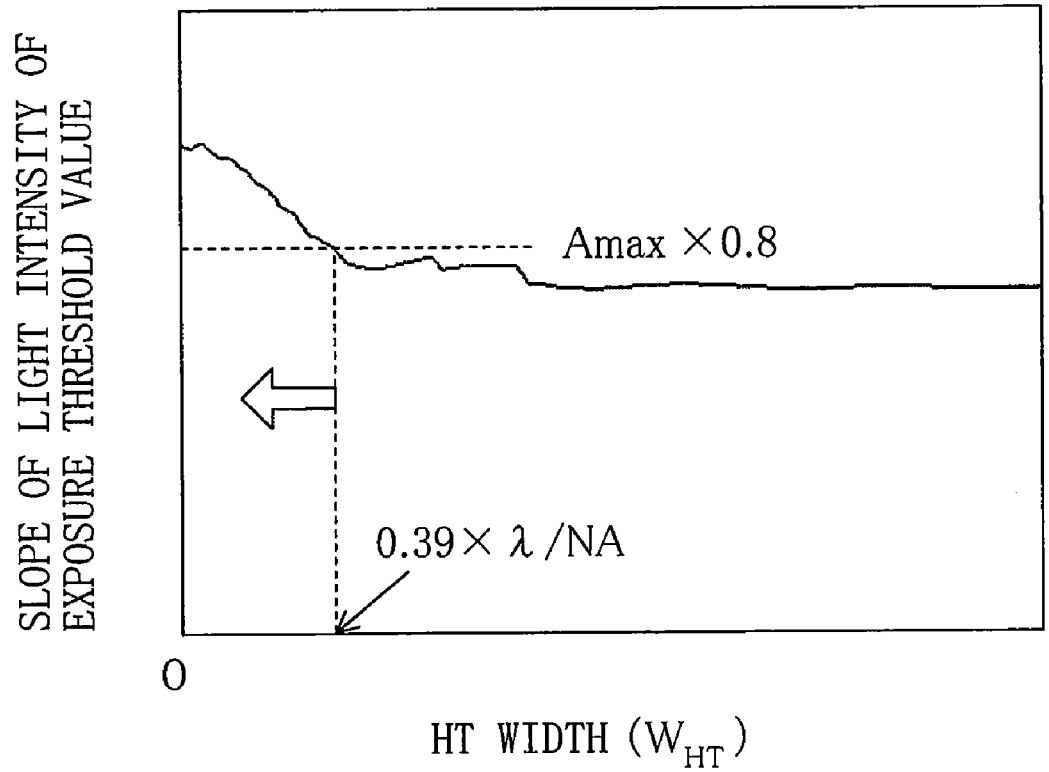
FIG. 5 is a diagram for showing the relationship, obtained by the present inventors through simulation, between the slope of light intensity profile of a light intensity value as an exposure threshold value and the HT width $W_{HT}$ of the second semi-light-shielding portion interposed between the opening and the light-shielding portion of the second light-shielding pattern.

FIG. 5 shows the relationship between the slope of light intensity profile of a light intensity value as an exposure threshold value and the HT width $W_{HT}$ obtained by the present inventors through simulation. In FIG. 5, the value of the slope of the light intensity profile is an absolute value. As the value increases, the slope of the light intensity profile becomes steeper. As shown in FIG. 5, when the HT width $W_{HT}$ is increased, the amount of exposing light passing through a portion of the second semi-light-shielding portion 2B at the edge of the second light-shielding pattern 7 is increased. Therefore, the slope of the light intensity profile of the light intensity value as the exposure threshold value becomes gentle. In order to obtain a resolution sufficiently high for transferring the pattern, the slope of the light intensity profile of the light intensity value as the exposure threshold value is preferably not less than 80% of the slope of the light intensity profile obtained when the Cr width $W_{Cr}$ is sufficiently large (Amax in FIG. 2). Specifically, when the HT width $W_{HT}$ is not more than $(0.39 \times \lambda/NA)$, the light-shielding property of the second light-shielding pattern 7 is improved and hence, a resolution sufficient for transferring the pattern is obtained.

As described above, in the photomask of FIGS. 4A and 4B in which the first light-shielding pattern 6 having the first dimension S1 not more than $0.5 \times \lambda/NA$ and the second light-shielding pattern 7 having the second dimension S2 larger than $0.5 \times \lambda/NA$ are simultaneously present, the HT width $W_{HT}$ of the second light-shielding pattern 7 is set to be not more than $(0.39 \times \lambda/NA)$ and the Cr width $W_{Cr}$ of the light-shielding portion 5 is set to be not less than $(0.17 \times \lambda/NA)$ and not more than $(1.72 \times \lambda/NA)$ as described above. As a result, the reduction of resolution is surely prevented and at the same time, the occurrence of a defect derived from an insoluble layer resulting from a completely unexposed region is surely prevented.

Figure 6:
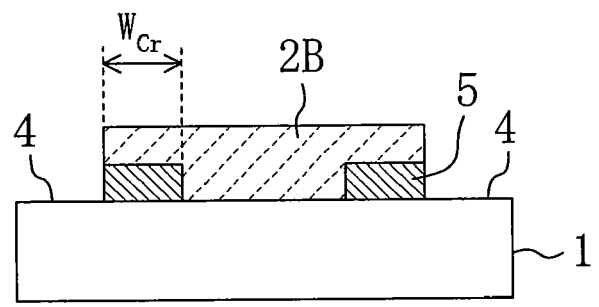
FIG. 6 is a cross-sectional view for showing a variation of the photomask according to the embodiment of the invention.

FIG. 6 is a cross-sectional view for showing another example of the photomask according to the embodiment of the invention, and specifically shows an exemplified variation of the cross-sectional structure shown in FIG. 1C, that is, a cross-sectional view taken on line B-B' of FIG. 1A crossing the second light-shielding pattern 7. In the photomask shown in FIG. 6, the light-shielding portion 5 is formed on the edge of the second light-shielding pattern 7. Side edge faces of a semi-light-shielding film serving as the second semi-light-shielding portion 2B and side edge faces of a light-shielding film serving as the light-shielding portion 5 are continuously formed at the same level. In the photomask of FIGS. 1A to 1C, the light-shielding film serving as the light-shielding portion 5 is formed on the semi-light-shielding film serving as the second semi-light-shielding portion 2B. On the other hand, in the photomask shown in FIG. 6, the light-shielding film serving as the light-shielding portion 5 is formed to be in contact with the transparent substrate 1 and the semi-light-shielding film serving as the second semi-light-shielding portion 2B is formed on the light-shielding film.

In employing the photomask structure shown in FIG. 6, even when the first light-shielding pattern 6 having the first dimension S1 not more than $0.5 \times \lambda/NA$ and the second light-shielding pattern 7 having the second dimension S2 larger than $0.5 \times \lambda/NA$ are simultaneously present, the reduction of resolution is surely prevented as well as the occurrence of a defect derived from an insoluble layer resulting from a completely unexposed region is surely prevented by setting the Cr width $W_{Cr}$ of the light-shielding portion 5 in the same manner as in the photomask shown in FIGS. 1A through 1C.

Figure 7:
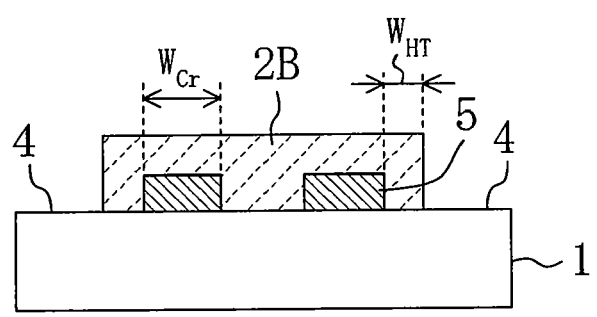
FIG. 7 is a cross-sectional view for showing another variation of the photomask according to the embodiment of the invention.

FIG. 7 is a cross-sectional view for showing another example of the photomask according to the embodiment of the invention, and specifically shows an exemplified variation of the cross-sectional structure shown in FIG. 4B, that is, a cross-sectional view taken on line C-C' of FIG. 4A crossing the second light-shielding pattern 7. Specifically, in the photomask of FIG. 7, a part of the second semi-light-shielding portion 2B (having a HT width $W_{HT}$) is present between the opening 4 and the light-shielding portion 5. In the photomask shown in FIGS. 4A and 4B, a light-shielding film serving as the light-shielding portion 5 is formed on a semi-light-shielding film serving as the second semi-light-shielding portion 2B. On the other hand, the photomask of FIG. 7 includes a light-shielding film serving as the light-shielding portion 5 formed in contact with the transparent substrate 1 and a semi-light-shielding film serving as the second semi-light-shielding portion 2B formed on the light-shielding film.

In employing the photomask structure shown in FIG. 7, even when the first light-shielding pattern 6 having the first dimension S1 not more than $0.5 \times \lambda/NA$ and the second light-shielding pattern 7 having the second dimension S2 larger than $0.5 \times \lambda/NA$ are simultaneously present, the reduction of resolution is surely prevented as well as the occurrence of a defect derived from an insoluble layer resulting from a completely unexposed region is surely prevented by setting the Cr width $W_{Cr}$ of the light-shielding portion 5 and the HT width $W_{HT}$ of the second semi-light-shielding portion 2B in the same manner as in the photomask of FIGS. 4A and 4B.

Figure 8:
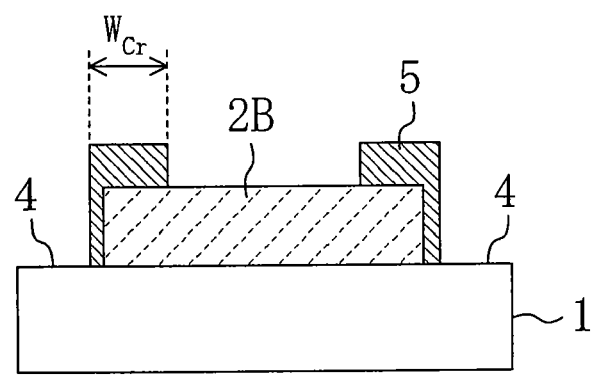
FIG. 8 is a cross-sectional view for showing still another variation of the photomask according to the embodiment of the invention.

FIG. 8 is a cross-sectional view for showing still another example of the photomask according to the embodiment of the invention, and specifically shows an exemplified variation of the cross-sectional structure shown in FIG. 1C, that is, a cross-sectional view taken on line B-B' of FIG. 1A crossing the second light-shielding pattern 7. Specifically, in the photomask of FIG. 8, the light-shielding portion 5 is formed on the edge of the second light-shielding pattern 7. Although side edge faces of the semi-light-shielding film serving as the second semi-light-shielding portion 2B and side edge faces of the light-shielding film serving as the light-shielding portion 5 disposed on the side of the opening 4 are continuously formed at the same level in the photomask shown in FIGS. 1A through 1C, the light-shielding film serving as the light-shielding portion 5 is formed on the semi-light-shielding film serving as the second semi-light-shielding portion 2B so as to cover the side edge face of the semi-light-shielding film disposed on the side of the opening 4 in the photomask of FIG. 8. In the photomask of FIG. 8, the Cr width $W_{Cr}$ of the light-shielding portion 5 is defined as a distance from an edge of the light-shielding portion 5 on the side of the opening 4 to an opposite edge of the light-shielding portion 5.

In employing the photomask structure shown in FIG. 8, even when the first light-shielding pattern 6 having the first dimension S1 not more than $0.5 \times \lambda/NA$ and the second light-shielding pattern 7 having the second dimension S2 larger than $0.5 \times \lambda/NA$ are simultaneously present, the reduction of resolution is surely prevented as well as the occurrence of a defect derived from an insoluble layer resulting from a completely unexposed region is surely prevented by setting the Cr width $W_{Cr}$ of the light-shielding portion 5 in the same manner as in the photomask shown in FIGS. 1A through 1C.

Although the light-shielding portion 5 is provided to completely or partially surround the semi-light-shielding portion 2B in the second light-shielding pattern 7 in all the aforementioned exemplified structures of the photomask of this embodiment, the light-shielding portion 5 need not completely surround the second semi-light-shielding portion 2B. For example, even when the plane structure shown in FIGS. 9A to 9D (the plane structure of the second light-shielding pattern 7 and its vicinity) is used, similar effects as those attained by any of the aforementioned photomask structures can be attained. A characteristic of the plane structure shown in FIGS. 9A to 9D is that the light-shielding portion 5 is disconnected at the corners of the second light-shielding pattern 7. Thus, each of disconnected parts of the light-shielding portion 5 has the length shorter than a corresponding side of the second light-shielding pattern 7, for example, in a rectangular shape.

Figure 9A:
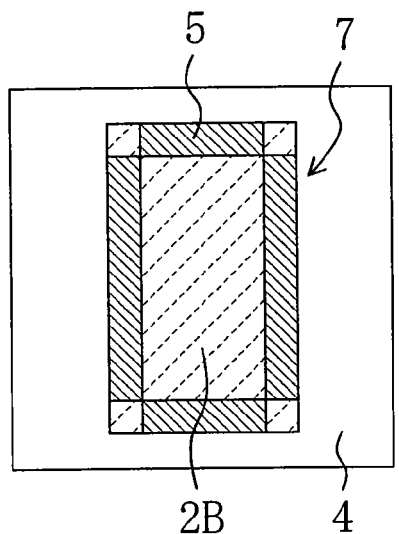
FIGS. 9A to 9D are plan views for showing variations of the photomask according to the embodiment of the invention.
Figure 9B:
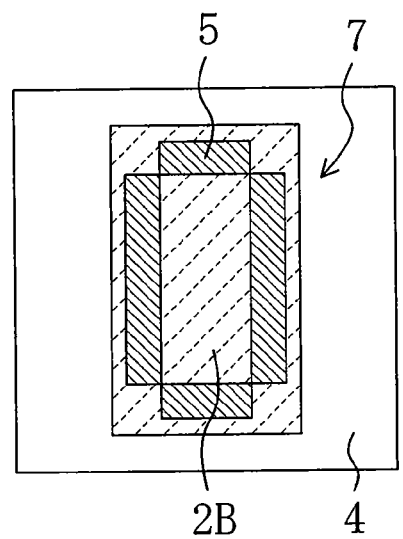
Figure 9C:
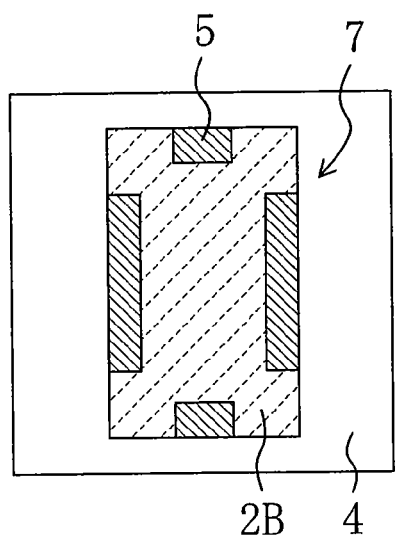
Figure 9D:
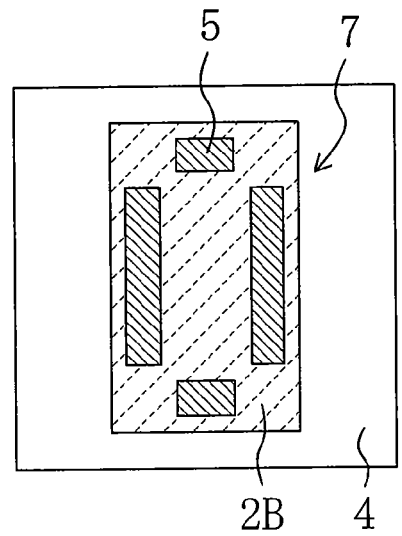

More specifically, in the photomask shown in FIG. 9A, parts of the light-shielding portion 5 at the corners of the second light-shielding pattern 7 are replaced with the second semi-light-shielding portion 2B. The photomask of FIG. 9B is similar to the photomask of FIG. 9A except that the second semi-light-shielding portion 2B is interposed between each of the disconnected parts of the light-shielding portion 5 and the opening 4. In the photomask of FIG. 9C, each of the disconnected parts of the light-shielding portion 5 has a length shorter than a corresponding side of the rectangular-shaped second light-shielding pattern 7 and each of the disconnected parts is in contact with the corresponding side of the second light-shielding pattern 7. Further, the photomask of FIG. 9D is similar to the photomask of FIG. 9C except that the second semi-light-shielding portion 2B is interposed between each of the disconnected parts of the light-shielding portion 5 and the opening 4.

Now, a pattern formation method using the photomask of this embodiment will be described with reference to the accompanying drawings.

Figure 10A:
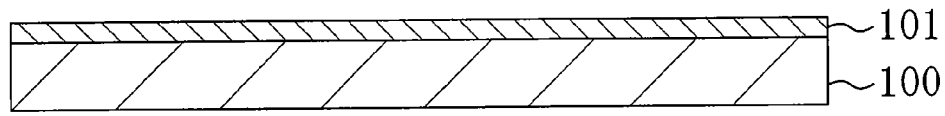
FIGS. 10A to 10D are cross-sectional views for showing procedures in a pattern formation method using the photomask according to the embodiment of the invention.
Figure 10B:
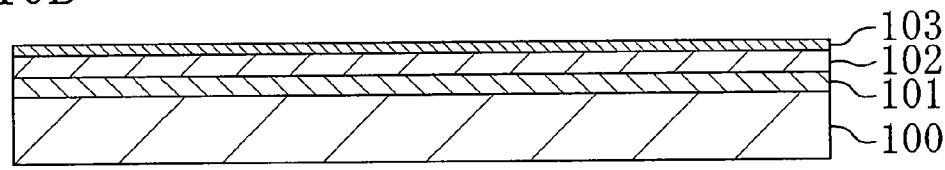
Figure 10C:
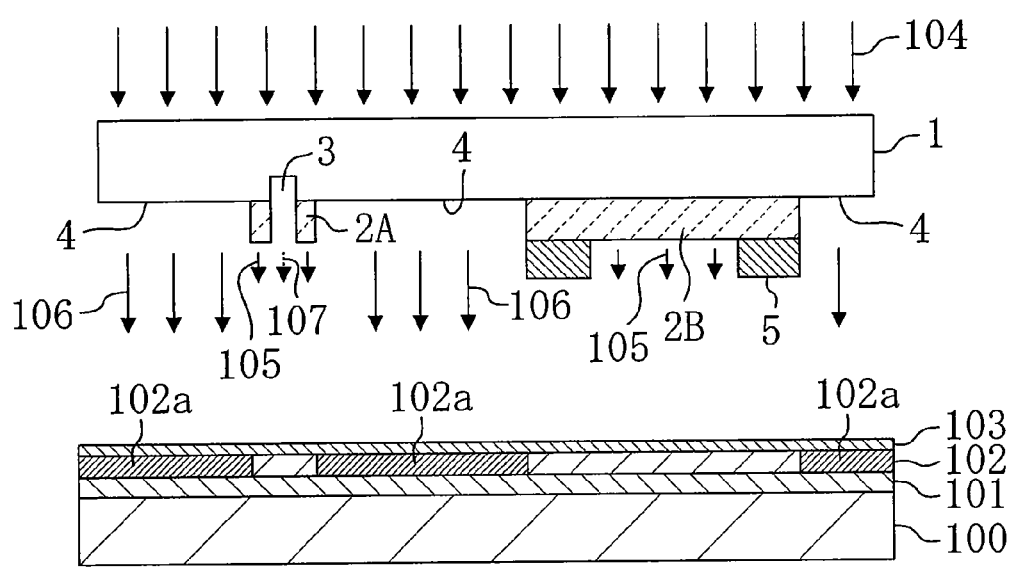

FIGS. 10A through 10D are cross-sectional views for showing procedures in the pattern formation method using the photomask of this embodiment. In FIG. 10C, like reference numerals are used to refer to like elements included in the photomask shown in FIGS. 1A through 1C so as to avoid repetition of the description.

First, as shown in FIG. 10A, a target film 101 of a metal film, an insulating film or the like is formed on a substrate 100, and thereafter, a positive resist film 102 is formed on the target film 101 as shown in FIG. 10B. At this point, when the immersion exposure is employed, a top coat 103 is further formed on the resist film 102 so as to coat the resist film 102.

Next, as shown in FIG. 10C, a photomask of this embodiment having a structure shown in, for example, FIGS. 1A through 1C, is irradiated with exposing light 104 using a light source of, for example, ArF excimer laser. At this point, the resist film 102 is exposed by transmitted light 106 having passed through the opening 4 of the photomask of this embodiment, resulting in forming a latent portion 102a corresponding to the opening 4. It is merely the latent portion 102a that is irradiated with exposure energy sufficient for completely dissolving the resist in development subsequently performed. On the other hand, in the first light-shielding pattern 6 (see FIG. 1A) of the photomask of this embodiment, transmitted light 105 having passed though the first semi-light-shielding portion 2B is in an identical phase to the transmitted light 106, while transmitted light 107 having passed through the auxiliary pattern 3 is in an opposite phase to the transmitted light 106. Therefore, the transmitted light 105 and the transmitted light 107 cancel each other, and therefore energy forming a latent portion is not generated. The transmitted light 105 having passed through the second semi-light-shielding portion 2B (a portion where the light-shielding portion 5 is not formed) in the second light-shielding pattern 7 (see FIG. 1A) of the photomask of this embodiment has an identical phase to the transmitted light 106, but does not have enough energy to form the latent portion. Further, as described above, the Cr width $W_{Cr}$ of the light-shielding portion 5 formed in the second light-shielding pattern 7 of the photomask of this embodiment is determined within a predetermined range. Therefore, there is no completely shielded region (completely unexposed region) with light intensity of 0 not only on the back of the second semi-light-shielding portion 2B (a portion where the light-shielding portion 5 is not formed) but also on the back of the light-shielding portion 5, but these backs are also irradiated with light with intensity lower than an exposure threshold value. Accordingly, even when the top coat 103 is formed, adhesion between an insoluble layer, formed on a contact face between the resist film 102 and the top coat 103, and the resist film 102 is low, and hence, the occurrence of a resist defect derived from an insoluble layer can be prevented.

Figure 10D:
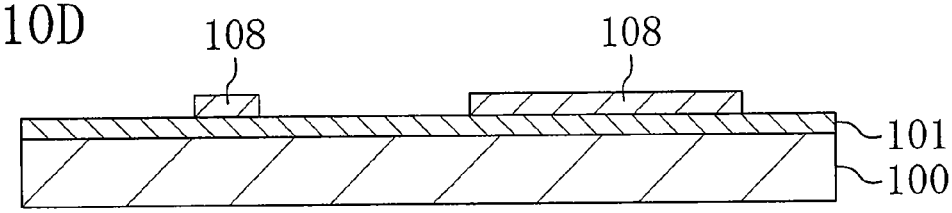

Next, the development is performed on the top coat 103 and the resist film 102 so as to remove the top coat 103 and the latent portion 102a of the resist film 102, resulting in forming a resist pattern 108 as shown in FIG. 10D.

Figure 11:
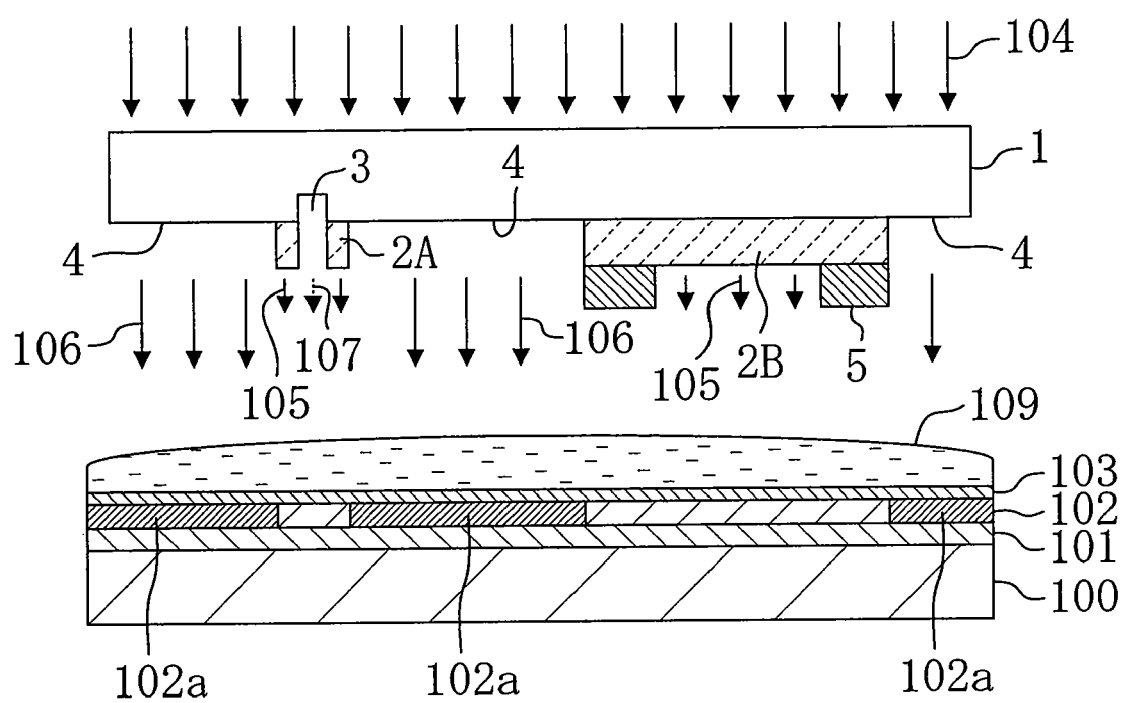
FIG. 11 is a view corresponding to FIG. 10C where the immersion exposure process is used.
Figure 12A:
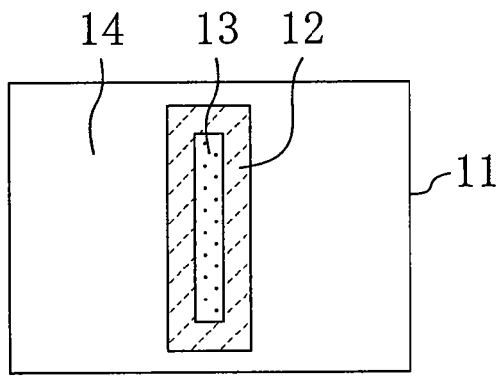
FIGS. 12A and 12B show an exemplified plane structure and an exemplified cross-sectional structure of an enhancer mask.
Figure 12B:
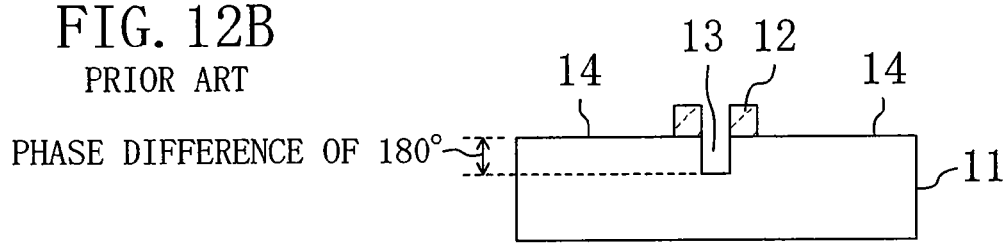
Figure 12C:
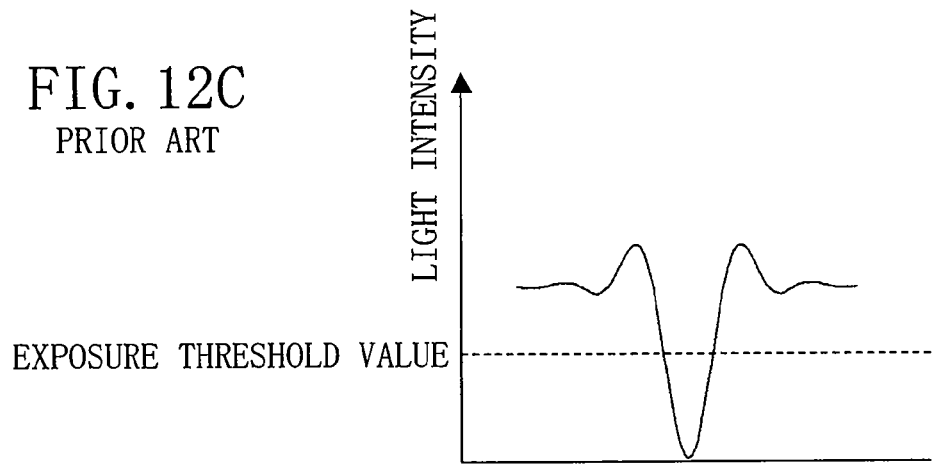
FIG. 12C is a diagram of a light intensity profile obtained in using the enhancer mask of FIGS. 12A and 12B and FIG. 12D is a schematic plan view of a pattern transferred onto a wafer by the enhancer mask of FIGS. 12A and 12B.
Figure 12D:
Figure 13A:
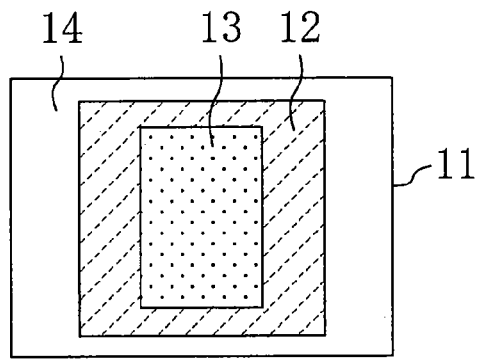
FIGS. 13A and 13B show an exemplified plane structure and an exemplified cross-sectional structure of an enhancer mask.
Figure 13B:
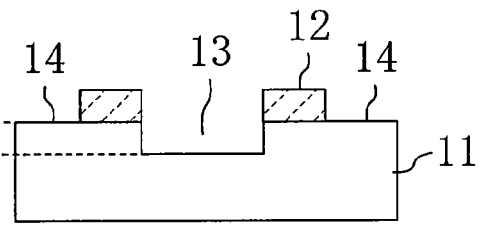
Figure 13C:
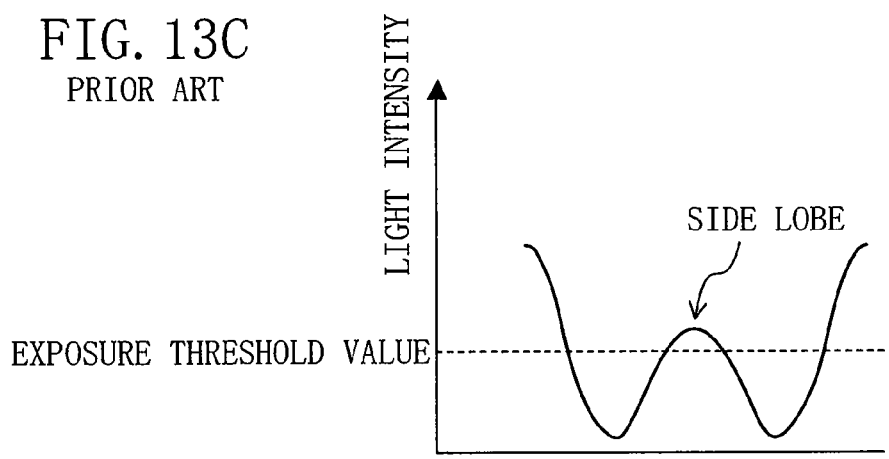
FIG. 13C is a diagram of a light intensity profile obtained in using the enhancer mask of FIGS. 13A and 13B and FIG. 13D is a schematic plan view of a pattern transferred onto a wafer by the enhancer mask of FIGS. 13A and 13B.
Figure 13D:
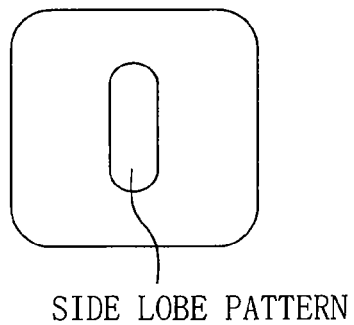
Figure 14A:
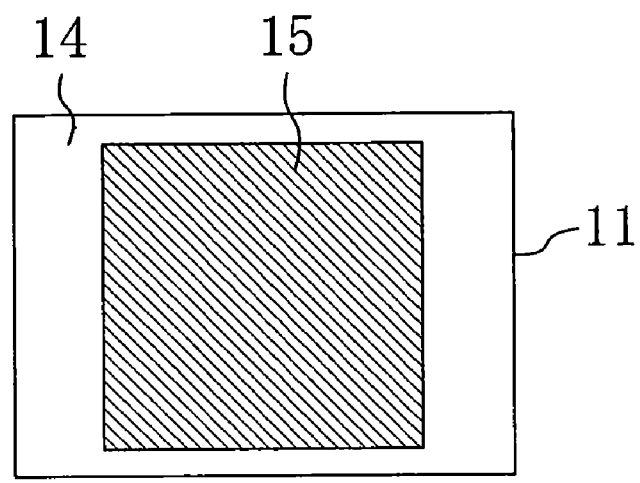
FIGS. 14A and 14B show an exemplified plane structure and an exemplified cross-sectional structure of a photomask including a light-shielding pattern formed of a light-shielding portion.
Figure 14B:
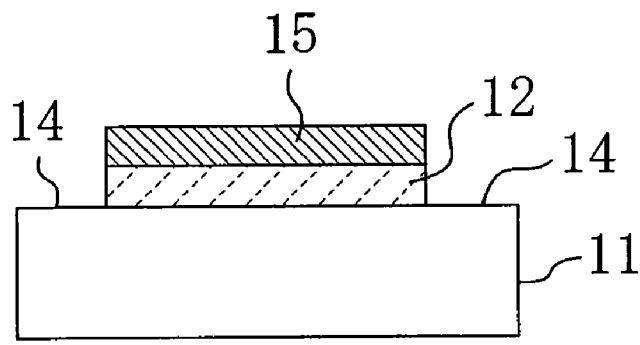

FIG. 11 is a diagram for showing a procedure corresponding to that shown in FIG. 10C performed when the immersion exposure process is employed. In the case where the immersion exposure process is employed, a similar procedure to that of FIG. 10C is carried out except that the exposure is performed with an immersion liquid 109 present on the top coat 103 as shown in FIG. 11.

As described so far, according to the present embodiment, even when an enhancer mask capable of simultaneously forming a fine isolated line pattern and densely arranged line patterns is used in an exposure process or an immersion exposure process using ArF excimer laser or the like as an exposing light source so as to simultaneously form the fine isolated line pattern and a line pattern larger than the fine pattern, the reduction of resolution and the occurrence of a resist defect in the formation of the larger pattern can be simultaneously prevented, so that a fine LSI can be fabricated.

What is claimed is:
1. A photomask comprising:
a mask pattern formed on a transparent substrate; and
a light-transmitting portion where the mask pattern is not formed on the transparent substrate, wherein the mask pattern includes a first light-shielding pattern having a first dimension, and a second light-shielding pattern having a second dimension larger than the first dimension, the first light-shielding pattern includes a first semi-light-shielding portion which allows the exposing light to partially pass through and an auxiliary pattern which is arranged within the first semi-light-shielding portion and allows the exposing light to pass through in an opposite phase with respect to the first semi-light-shielding portion, the second light-shielding pattern includes a second semi-light-shielding portion which allows the exposing light to partially pass through and a light-shielding portion which does not substantially allow the exposing light to pass through, and the first semi-light-shielding portion and the second semi-light-shielding portion allow the exposing light to pass through in an identical phase with respect to the light-transmitting portion.

2. The photomask of claim 1,
wherein the light-shielding portion is arranged on the edge of the second light-shielding pattern.

3. The photomask of claim 2,
wherein the light-shielding portion is disconnected at a corner of the second light-shielding pattern.

4. The photomask of claim 3,
wherein each disconnected part of the light-shielding portion has a length shorter than a corresponding side of the second light-shielding pattern.

5. The photomask of claim 2,
wherein the light-shielding portion has a width set to be not less than a minimum width with which a resolution required for transferring the second light-shielding pattern is obtained.

6. The photomask of claim 2,
wherein the light-shielding portion has a width set to be not more than a maximum width with which an unexposed region is not formed.

7. The photomask of claim 2,
the photomask is designed for a specific reduction projection optical system and is included in such a system along with an exposure apparatus, and
wherein the light-shielding portion of the photomask has a width not less than $(0.17 \times \lambda/NA) \times M$, where $\lambda$ is a wavelength of the exposing light, NA is numerical aperture of a reduction projection optical system of an aligner and M is a reduction ratio of the reduction projection optical system.

8. The photomask of claim 2,
the photomask is designed for a specific reduction projection optical system and is included in such a system along with an exposure apparatus, and
wherein the light-shielding portion of the photomask has a width not more than $(1.72 \times \lambda/NA) \times M$, where $\lambda$ is a wavelength of the exposing light, NA is numerical aperture of a reduction projection optical system of an aligner and M is a reduction ratio of the reduction projection optical system.

9. The photomask of claim 2,
wherein in the second light-shielding pattern, a side face of a semi-light-shielding film serving as the semi-light-shielding portion and a side face of a light-shielding film serving as the light-shielding portion are continuously formed at the same level.

10. The photomask of claim 2,
wherein a part of the second semi-light-shielding portion is present between an edge of the second light-shielding pattern and the light-shielding portion.

11. The photomask of claim 10,
the photomask is designed for a specific reduction projection optical system and is included in such a system along with an exposure apparatus, and
wherein the part of the second semi-light-shielding portion of the photomask present between an edge of the second light-shielding pattern and the light-shielding portion has a width not more than $(0.39 \times \lambda/NA) \times M$, where $\lambda$ is a wavelength of the exposing light, NA is numerical aperture of a reduction projection optical system of an aligner and M is a reduction ratio of the reduction projection optical system.

12. The photomask of claim 2,
the photomask is designed for a specific reduction projection optical system and is included in such a system along with an exposure apparatus, and
wherein the first dimension is not more than $(0.5 \times \lambda/NA) \times M$ and the second dimension is larger than $(0.5 \times \lambda/NA) \times M$, where $\lambda$ is a wavelength of the exposing light, NA is numerical aperture of a reduction projection optical system of an aligner and M is a reduction ratio of the reduction projection optical system.

13. A pattern formation method using the photomask of claim 1, comprising the steps of:
  (a) forming a resist film on a substrate;
  (b) irradiating the resist film with the exposing light through the photomask; and
  (c) patterning the resist film by developing the resist film having been irradiated with the exposing light.

14. The pattern formation method of claim 13,
wherein ArF excimer laser is used as an exposing light source in the step (b).

15. The pattern formation method of claim 14,
wherein immersion exposure process is employed in the step (b).

16. The pattern formation method of claim 15,
wherein the step (a) includes a sub-step of coating the resist film with a top coat.

17. The photomask of claim 1, wherein
the second light-shielding pattern includes only the second semi-light-shielding portion and the light-shielding portion.

18. The photomask of claim 2, wherein
the phase-shifting portion is formed by digging the transparent substrate.

19. The photomask of claim 2, wherein
in the second light-shielding pattern, a light-shielding film constituting the light-shielding portion is formed on the transparent substrate with a semi-light-shielding film constituting the second semi-light-shielding portion interposed between the light-shielding film and the transparent substrate.

* * * * *

UNITED STATES PATENT AND TRADEMARK OFFICE
CERTIFICATE OF CORRECTION

| | | |
|---|---|---|
| PATENT NO. | : 7,914,953 B2 | Page 1 of 1 |
| APPLICATION NO. | : 12/204252 | |
| DATED | : March 29, 2011 | |
| INVENTOR(S) | : Shimizu et al. | |

It is certified that error appears in the above-identified patent and that said Letters Patent is hereby corrected as shown below:

On the Title Page:
In Item (56) References Cited:

On page 2 in Column 1, Line 2 under U.S. PATENT DOCUMENTS

Delete "2006/0121384 A1    6/2006    Patel et al."

And

Enter 2006/0121364 A1    6/2006    Omura et al.

Signed and Sealed this
Seventeenth Day of May, 2011

David J. Kappos
*Director of the United States Patent and Trademark Office*